United States Patent [19]
Glogovsky

[11] Patent Number: 6,030,903
[45] Date of Patent: Feb. 29, 2000

[54] NON-DESTRUCTIVE METHOD FOR GAUGING UNDERCUT IN A HIDDEN LAYER

[75] Inventor: Kenneth Gerard Glogovsky, Kempton, Pa.

[73] Assignee: Lucent Technologies Inc., Murray Hill, N.J.

[21] Appl. No.: 09/186,991

[22] Filed: Nov. 5, 1998

[51] Int. Cl.$^7$ .................................................. H01L 21/00
[52] U.S. Cl. ......................................... 438/738; 438/739
[58] Field of Search ..................................... 438/738, 739

[56] References Cited

U.S. PATENT DOCUMENTS

| | | | |
|---|---|---|---|
| 4,529,860 | 7/1985 | Robb | 219/121 |
| 4,566,935 | 1/1986 | Hornbeck | 156/626 |
| 4,956,619 | 9/1990 | Hornbeck | 330/4.3 |
| 5,068,707 | 11/1991 | Pors et al. | 357/59 |
| 5,256,577 | 10/1993 | Pluntke et al. | 437/8 |
| 5,264,328 | 11/1993 | DellaGuardia et al. | 430/322 |

*Primary Examiner*—Benjamin Utech
*Assistant Examiner*—Vanessa Perez-Ramos

[57] ABSTRACT

A method for non-destructively determining the amount of undercutting in a hidden layer of material disposed on a substrate after device patterning by etching. The method involves forming at least two lines of etch resistant material of increasing width over the hidden layer of material of the substrate and inspecting the lines after etching for a given time period to determine how many lines have been removed. The width dimension of the largest removed line corresponds approximately to the amount of undercut for two sides in the hidden layer of material after etching for the given time period.

11 Claims, 2 Drawing Sheets

NON-DESTRUCTIVE METHOD FOR GAUGING UNDERCUT IN A HIDDEN LAYER

FIELD OF THE INVENTION

This invention relates to the fabrication of optical and electronic devices, and in particular, to a test pattern for non-destructive, gauging of undercutting in a hidden layer.

BACKGROUND OF THE INVENTION

Etching processes are used for selectively removing metal and dielectric films in the fabrication of optical and electronic devices. These etching processes usually exhibit either anisotropic or isotropic etching behavior. Anisotropic etching involves etching along only one crystal axis of the material or along each of the crystal axes of the material at substantially different rates. This type of etching typically produces vertical rather than lateral etching. Dry etching processes such as ion beam milling, reactive ion etching and plasma etching, generally exhibit anisotropic etching behavior.

Isotropic etching behavior involves etching rates which are generally the same along plural crystal axes of the material. Isotropic etching typically produces both vertical and lateral etching of material. The lateral etching usually undercuts the mask layer. Wet chemical etching generally exhibits isotropic etching behavior, and some dry etching processes can also exhibit isotropic etching.

Gauging the amount of undercutting during isotropic etching is important for maintaining repeatability and consistency of device fabrication processes. The amount of undercutting can be determined visually in some cases if the material being etched involves a single layer or multiple transparent layers. However, where the material involves opaque multiple layers, the undercutting of the lowest layer or layers may be visually hidden by the layers on top. This inability to determine undercut is especially troublesome when the etchant is selective to the lower hidden layer, i.e., where the hidden layer etches at a significantly faster rate than the overlying layer.

Conventional methods such as cross-section SEM, TEM and additional selective etching have been used for gauging the amount of undercutting of visually hidden layers. Unfortunately, all of these methods involve costly destruction of the device.

Accordingly, a non-destructive method for determining the amount of undercutting of visually hidden layers is needed for maintaining repeatability and consistency in isotropic etching processes used in optical and electronic device fabrication.

SUMMARY

A method for non-destructively determining the amount of undercutting in a hidden layer of material disposed on a substrate after device patterning by etching. The method comprises forming at least two lines of etch resistant material of increasing width over the hidden layer of material of the substrate and inspecting the workpiece after etching to determine how many lines have been removed. The width dimension of the largest removed line provides a measure of the undercut in the hidden layer.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
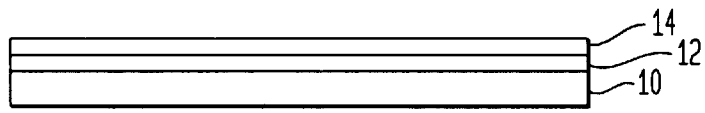
FIG. 1 is a sectional view of a typical substrate to be evaluated using the method of the present invention.

FIG. 1 is a sectional view showing a typical substrate 10, such as a semiconductor wafer, to be evaluated after etching using the test pattern and method of the present invention. The substrate 10 includes a hidden layer 12 of metallic, dielectric or semiconductive material deposited directly on a principle surface of the substrate 10 followed by a non-transparent upper layer 14 of metallic, dielectric or semiconductive material.

Figure 2A:
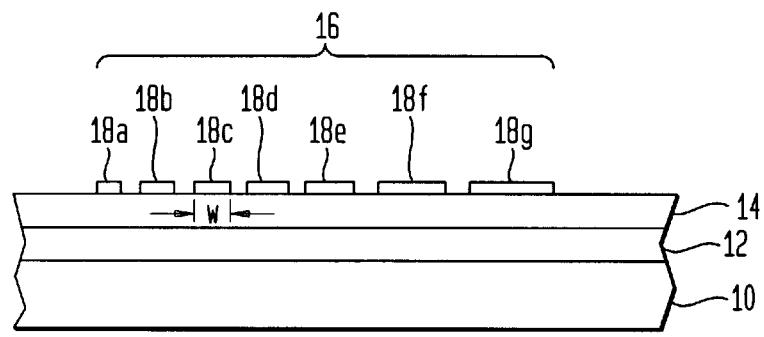
FIGS. 2A and 2B are respective sectional and top views of a non-device area of the substrate of FIG. 1 after depositing thereon a test pattern for gauging the amount of undercut of the hidden layer after etching.
Figure 2B:
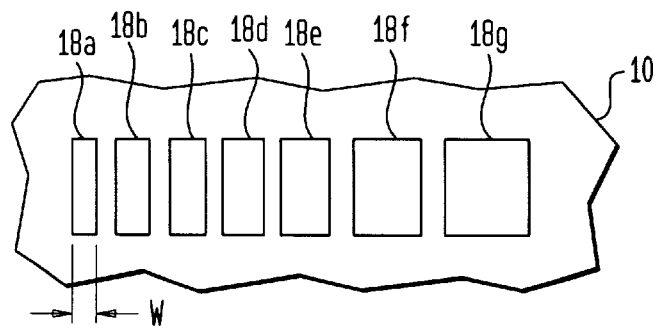

FIGS. 2A and 2B are respective sectional and top views of a non-device area of the substrate 10 of FIG. 1 after the deposition of a test pattern 16 for gauging the amount of undercut of the hidden layer after etching. The test pattern 16 comprises an inline array of two or more lines 18a–18g of increasing width W. The lines 18a –18g are typically made from photoresist or any other suitable masking material such silicon dioxide. This permits one or more test patterns 16 to be easily fabricated in non-device areas of the substrate 10 using conventional photolithographic methods.

Figure 3:
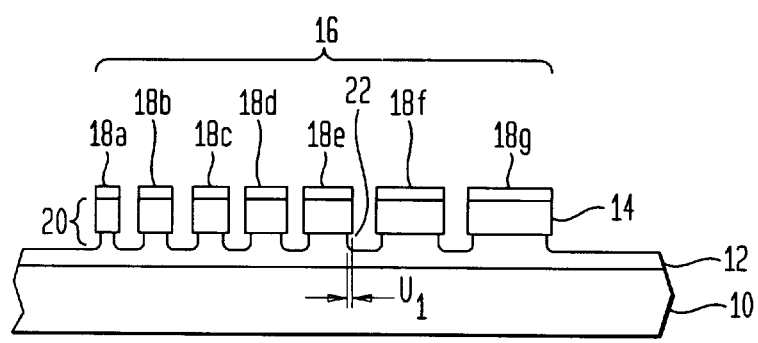
FIG. 3 is a sectional view of the substrate 10 after etching for a time $T_1$.

FIG. 3 is a sectional view showing the substrate 10 after etching for a time ($T_1$) sufficient to completely etch through the unmasked portions of the upper layer 14 and etch partially into the underlying portions of the hidden layer 12. Etching produces stacked island-like structures 20 beneath the lines consisting of portions of the upper and hidden layers 14, 12. The isotropic etching behavior in the hidden layer 12 removes material both laterally and vertically. The lateral etching component produces an undercut region 22 of width $U_1$ in hidden layer portion of each island 20 (the undercut region 22 extends along the periphery of the hidden layer portion).

Figure 4:
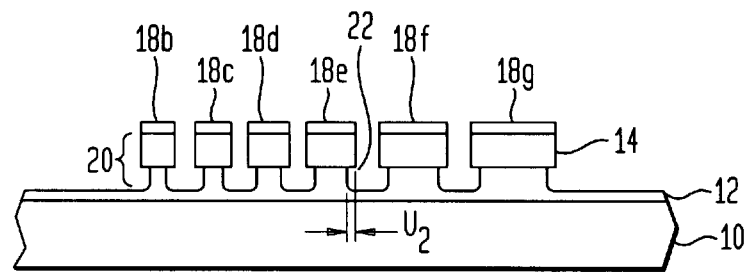
FIG. 4 is a sectional view showing the substrate 10 after etching for a time $T_2$.

FIG. 4 is a sectional view showing the substrate 10 after etching for a time ($T_2$) sufficient to eliminate line 18a. As the time of etching increases, the width of the undercut regions 22 increase until the hidden layer portions of the islands 20 are sequentially eliminated starting with the hidden layer portion under the thinnest line. The remaining portion of the island 20 (the upper layer portion and the corresponding line) becomes dislodged from the substrate. Increasing or decreasing the time duration of the etching process respectively increases or decreases the number of hidden layer portions which are eliminated under the lines 18a–18g and thus, the number of lines which are dislodged from the substrate 10.

If the etching process is by wet chemical etching, the etchant will wash away the dislodged islands 20 and their corresponding lines. Dry etching processes will typically require a separate washing step to remove the unsupported upper layer islands 20.

Figure 5:
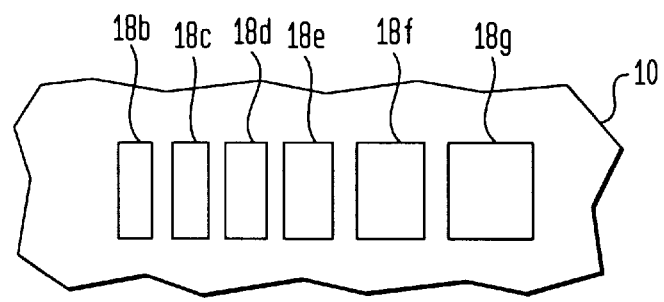
FIG. 5 is a top view of the substrate 10 shown in FIG. 4.

FIG. 5 is a top view of the substrate 10 shown in section in FIG. 4. FIG. 5 shows the test pattern 16 viewed with an optical microscope. The test pattern 16 provides a visual indication of the elimination of line 18a. The width dimension W of the largest removed line will approximately correspond to the amount of undercut for two (2) sides in the hidden layer 12 after etching for time $T_2$. In the case of FIG. 5, the largest removed line is 18a. Thus, the amount of undercut for two sides in the hidden layer 12 after etching for time $T_2$ is measured by the width dimension of line 18a.

Undercut information can be advantageously used for evaluating undercut uniformity both intra and inter substrate. This type of information also permits statistical process control techniques to be used to address undercut issues in the etching process.

Figure 6:
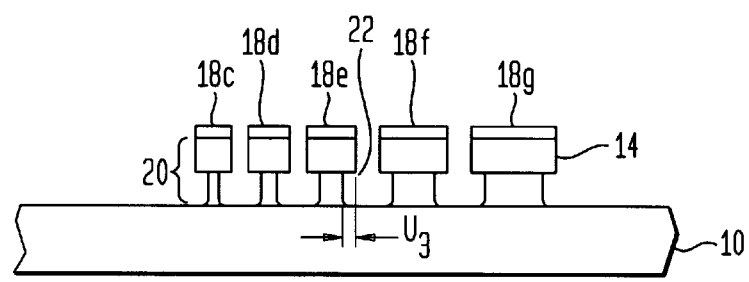
FIG. 6 is a sectional view showing the substrate 10 after etching for a time $T_3$.

FIG. 6 is a sectional view showing the substrate 10 after etching for a time ($T_3$) sufficient to eliminate lines 18a and 18b. Since line 18b is the largest removed line, the amount of undercut in the hidden layer 12 after etching for time $T_3$ is approximately equal to the width dimension of line 18b.

Figure 7:
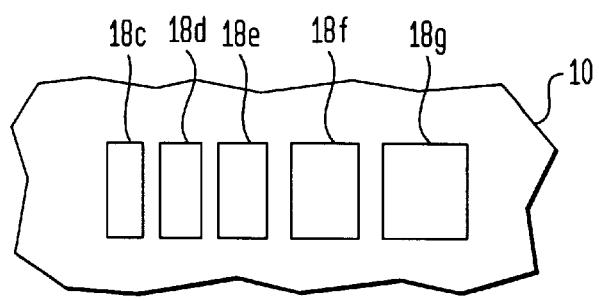
FIG. 7 is a top view of the substrate 10 shown in FIG. 6.

FIG. 7 is a top view of the substrate 10 shown in section in FIG. 6. In FIG. 7 the test pattern 16 provides a visual indication of the elimination of lines 18a and 18b. The width dimension W of the removed line 18b approximately corresponds to the amount of undercut for two (2) sides in the hidden layer 12 after etching for time $T_3$.

It is understood that the above-described embodiments illustrate only a few of the many possible specific embodiments which can represent applications of the principles of the invention. Further modifications and changes can be made by those skilled in the art without departing from the spirit and scope of the invention.

What is claimed is:

1. In a substrate having a hidden layer of material to be patterned into electronic or optical devices, a method for non-destructively determining the amount of undercutting of the hidden layer after device patterning by isotropic etching, the method comprising the steps of:

forming at least one etch resistant test pattern over the hidden layer of the substrate, the test pattern including at least two lines of increasing width;

isotropically etching the hidden layer for a given time period, the etching undercutting the hidden layer beneath each of the lines, and substantially eliminating an entire portion of the hidden layer beneath at least one of the lines at the end of the time period, thereby dislodging the corresponding line from the substrate;

inspecting the test pattern of the substrate to determine how many lines have been dislodged.

2. The method according to claim 1, wherein the at least two lines comprises a plurality of lines of increasing width arranged in an inline array.

3. The method according to claim 1, wherein the at least two lines are patterned from etch mask material.

4. The method according to claim 3, wherein the etch mask material is photoresist.

5. The method according to claim 1, wherein the at least one test pattern is formed in a non-device area of the substrate.

6. The method according to claim 1, wherein the at least one test pattern comprises a plurality of test patterns formed in non-device areas of the substrate.

7. The method according to claim 1, wherein the at least one test pattern is formed simultaneously with an etch mask used for patterning the hidden layer of material into electronic or optoelectronic devices.

8. The method according to claim 1, further comprising an upper layer of material disposed between the lines and the hidden layer of material, the upper layer visually obstructing the hidden layer, the etching step undercutting the material of the hidden layer more than the material of the upper layer, the dislodged lines representing the amount of undercutting in the hidden layer of material.

9. The method according to claim 8, wherein the upper layer is selected from the group consisting of metallic, dielectric and semiconductive materials.

10. The method according to claim 8, wherein the hidden layer is selected from the group consisting of metallic, dielectric and semiconductive materials.

11. The method according to claim 1, wherein the hidden layer of material is one of a plurality of layers to be patterned, the hidden layer having the fastest horizontal etch rate and being hidden by at least one of the other plurality of layers.

* * * * *